United States Patent [19]
Okamoto et al.

[11] Patent Number: 6,144,269
[45] Date of Patent: *Nov. 7, 2000

[54] NOISE-CUT LC FILTER FOR POWER CONVERTER WITH OVERLAPPING ALIGNED COIL PATTERNS

[75] Inventors: Kenji Okamoto; Shinji Uchida; Takao Maeda, all of Kanagawa; Takashi Aihara, Tokyo; Yoshihiro Matsumoto, Mie; Naoto Fukasawa, Kanagawa, all of Japan

[73] Assignee: Fuji Electric Co., Ltd., Japan

[*] Notice: This patent is subject to a terminal disclaimer.

[21] Appl. No.: 09/143,215

[22] Filed: Aug. 28, 1998

Related U.S. Application Data

[63] Continuation-in-part of application No. 08/872,541, Jun. 10, 1997, Pat. No. 5,892,668.

[30] Foreign Application Priority Data

Aug. 28, 1997 [JP] Japan ................................. 9-233080

[51] Int. Cl.[7] ............................. H03H 7/01; H02M 1/12
[52] U.S. Cl. ...................... 333/184; 333/185; 336/232; 336/200; 363/40
[58] Field of Search ........................... 333/181, 184, 333/185; 336/200, 232; 363/40

[56] References Cited

U.S. PATENT DOCUMENTS

| | | | |
|---|---|---|---|
| 4,928,138 | 5/1990 | Walton et al. .......................... | 363/40 |
| 5,003,959 | 4/1991 | Umezaki et al. ........................ | 123/647 |
| 5,250,915 | 10/1993 | Ikeda et al. ............................... | 333/181 |
| 5,363,080 | 11/1994 | Breen ................................... | 336/200 X |
| 5,892,668 | 4/1999 | Okamoto et al. .................... | 333/181 X |

FOREIGN PATENT DOCUMENTS

| | | | |
|---|---|---|---|
| 60-39375 | 3/1985 | Japan ........................................ | 363/40 |
| 62-53013 | 3/1987 | Japan ....................................... | 333/181 |
| 1-27305 | 1/1989 | Japan ....................................... | 333/185 |
| 5-205943 | 8/1993 | Japan ....................................... | 336/200 |

*Primary Examiner*—Justin P. Bettendorf
*Attorney, Agent, or Firm*—Rossi & Associates

[57] ABSTRACT

A noise-cut filter having distributed inductances and distributed capacitances is provided wherein conductive spiral coil patterns are formed on the opposite surfaces of a dielectric sheet, such that the spiral coil patterns are aligned with each other in a direction perpendicular to the plane of the dielectric sheet, and a main circuit pattern is constructed by bonding a main circuit conductor to the spiral coil pattern formed on one of the opposite surfaces of the dielectric sheet. The main circuit conductor is formed by stamping with a punch press so that the conductor has a cross sectional area large enough to allow the passage of current of a main circuit, and has substantially the same shape as the spiral coil pattern. Further, a grounding wire is bonded to the spiral coil pattern formed on the other surface of the dielectric sheet, so that the grounding wire leads the current involving noises which flows from the main circuit pattern into the spiral coil pattern via the dielectric sheet, to a ground terminal.

9 Claims, 5 Drawing Sheets

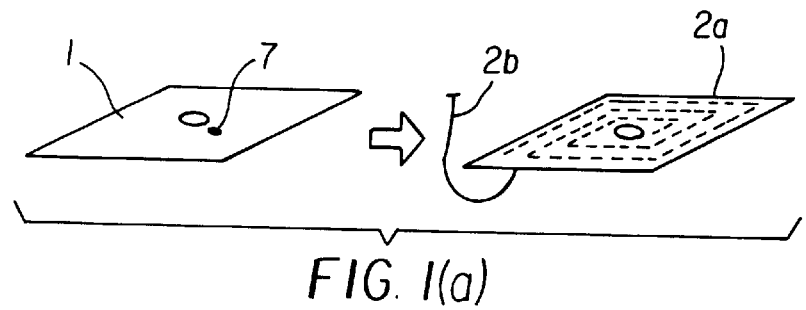
FIG. 1(a)
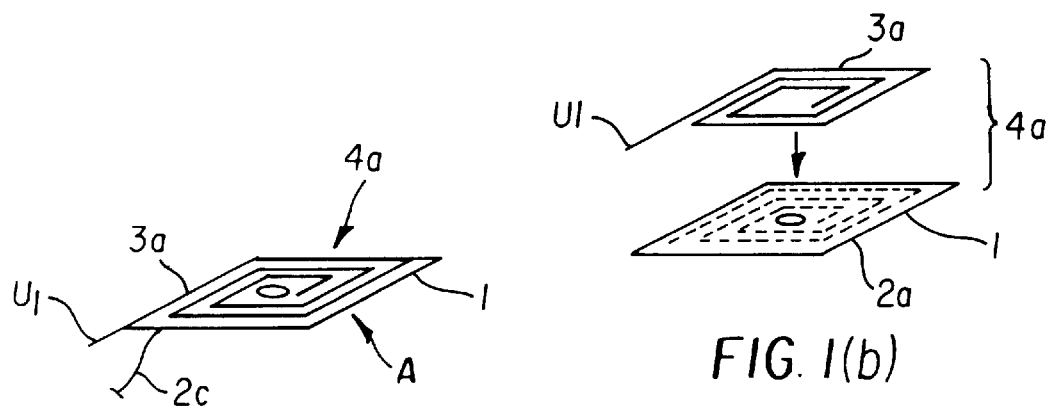
FIG. 1(c)
FIG. 1(b)
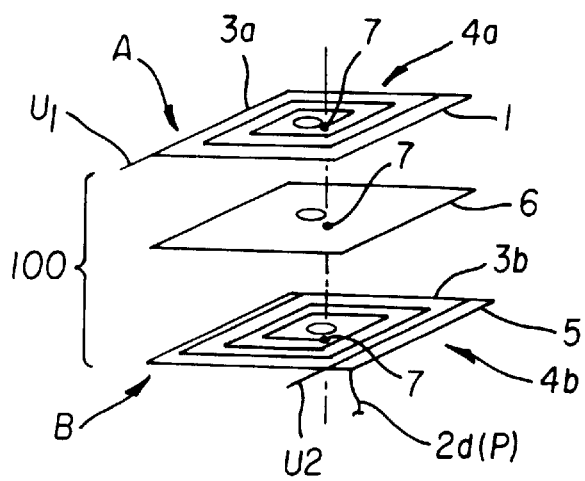
FIG. 1(d)

NOISE-CUT LC FILTER FOR POWER CONVERTER WITH OVERLAPPING ALIGNED COIL PATTERNS

CROSS-REFERENCE TO RELATED APPLICATIONS

This application is a continuation-in-part application, and claims priority from, U.S. patent application Ser. No. 08/872,541 entitled "Noise-Cut Filter for Power Converter" filed Jun. 10, 1997, the contents of which are herein incorporated, now issued as U.S. Pat. No. 5,892,668.

FIELD OF THE INVENTION

The present invention generally relates to noise-cut filters for power converters, and in particular to noise-cut filters for filtering switching noises that occur upon switching operations of semiconductor switching devices that constitute a power converter, such as an inverter.

BACKGROUND OF THE INVENTION

Semiconductor switching devices of a power converter, such as an inverter, perform switching operations based on drive signals which undergo pulse width modulation (PWM) with the carrier frequency being in the range of several KHz to about twenty KHz. During the switching operations, switching noises having frequency components of several dozens of KHz are generated from the power converter.

Of the frequency components of the switching noises as described above, those components having a frequency of one hundred KHz or higher have adverse influences on external equipment. In view of this situation, various legal regulations have been laid on power converters in recent years, in an attempt to reduce or eliminate such adverse influences. To deal with the regulations, the power converters are equipped with suitable noise-cut filters.

A known example of noise-cut filter for a power converter includes a single reactor in which an electric wire is wound around a core formed of, for example, ferrite, amorphous alloy, or crystalline alloy, and a single condenser in the form of a film or a chip. The reactor and the condenser are coupled into an inverted L-shape, to provide a filter for filtering switching noises that occur upon switching operations of a semiconductor switching device of the power converter.

As one of prior-art references concerning noise-cut filters for power converters, "Integrated Output Filter and Diode Snubber for Switchmode Power Converters", IEEE, 1994, pp. 1240–1245 discloses a filter circuit having an integrated, flat-sheet structure including a rectifier, RC snubber circuit, and an LC filter circuit. This reference also provides explanation of basic methods for manufacturing the respective circuits.

In addition, "Integrated Filters For Switch-Mode Power Supplies", IEEE, 1995, pp. 809–816 as another prior-art reference discloses three types of LC filter circuits having difference structures depending upon dielectric materials used therein. Namely, the dielectric materials are classified into those having a ceramic structure, and those having a non-ceramic structure, and one type of filter circuit (using $BaTiO_3$ as a dielectric material) having a flat-sheet structure is proposed as of a type using a ceramic material as a dielectric, while two types of filter circuits (sheet type, and vapor deposition type using plasma) having a film-like structure are proposed as of a type using a nonceramic material as a dielectric.

The reactor used in the above-described known type of noise-cut filter generally has a toroidal shape, and the capacitor is a pin-inserted type and has a flat shape or a cylindrical shape. Where the reactor and capacitor are mounted on a printed board inside the power converter, a space required for mounting these components will be greater than the sum of the volumes of the respective components, resulting in a reduced assembling efficiency. Where this type of noise-cut filter is mounted on the printed board by separate wiring, the number of coupling portions will be increased, and the manner of fixing the individual components will be undesirably complicated.

A so-called composite LC filter of a chip type or pin-inserted type, which is commercially available and includes a composite unit of inductor and capacitor, has a cut-off frequency of several MHz or higher, whereas the cut-off frequency normally required to filter switching noises occurring upon switching operations of semiconductor switching devices is as low as about 150 KHz, for example. Thus, the commercially available filters are unable to filter the switching noises occurring upon switching operations of the semiconductor switching devices.

Furthermore, in a power converter such as an inverter, several amperes of current is desired or required to flow through a noise-cut filter used for the converter. It is thus difficult to employ the commercially available composite LC filter as the noise-cut filter, in view of the current capacity and the cost.

The filter circuits disclosed in the above-identified two prior-art references have problems of complicated manufacturing methods, which make the circuits unsuitable for practical use and result in increased manufacturing cost.

SUMMARY OF THE INVENTION

It is therefore an object of the present invention to provide a noise-cut filter which is able to deal with low-frequency noises, while assuring a sufficiently large current capacity.

It is another object of the invention to provide a small-sized, inexpensive noise-cur filter having an excellent operating reliability, which filter is fabricated by a simple manufacturing method in which suitable circuit patterns can be easily mounted on a substrate.

To accomplish the first object, a noise-cut filter is provided which includes: a first dielectric sheet; first and second spiral coil patterns formed on opposite surfaces of the first dielectric sheet, respectively, such that the first and second spiral coil patterns are aligned with each other in a direction perpendicular to a plane of the first dielectric sheet, the first and second spiral coil patterns being formed from a conductive paste; a first main circuit pattern having a function of inductors and formed by bonding a first main circuit conductor to the first spiral coil pattern formed on one of the opposite surfaces of the first dielectric sheet, the conductor being formed by stamping with a punch press so that the conductor has a cross sectional area large enough to allow a desired level of current to flow therethrough, and has substantially the same shape as the first spiral coil pattern; a first grounding wire connected to the second spiral coil pattern formed on the other surface of the first dielectric sheet remote from the first main circuit pattern, the first grounding wire leading a current involving noises which flows from the first main circuit pattern into the second spiral coil pattern via the first dielectric sheet having a function of capacitors, to a ground terminal; a second dielectric sheet formed in the shape of a flat sheet; third and fourth spiral coil patterns formed on opposite surfaces of the second dielectric sheet, respectively, such that the third and fourth spiral coil patterns are aligned with each other in a direction perpendicular to a plane of the second dielectric sheet, the third and fourth spiral coil patterns being formed from a conductive paste; a second main circuit pattern having a function of inductors and formed by bonding a second main circuit conductor to the third spiral coil pattern formed on one of the opposite surfaces of the second dielectric sheet, the conductor being formed by stamping with a punch press so that the conductor has a cross sectional area large enough to allow a desired level of current to flow therethrough, and has substantially the same shape as the third spiral coil pattern; a second grounding wire bonded to the fourth spiral coil pattern formed on the other surface of the second dielectric sheet remote from the second main circuit pattern, the second grounding wire leading a current involving noises which flows from the second main circuit pattern into the fourth spiral coil pattern via the second dielectric sheet having a function of capacitors, to a ground terminal; and an insulating sheet formed in the shape of a flat sheet, which is interposed between the first dielectric sheet carrying the first main circuit pattern and the first grounding wire, and the second dielectric sheet carrying the second main circuit pattern and the second grounding wire thereon; wherein one of opposite ends of the first main circuit conductor is connected to one of opposite ends of the second main circuit conductor, such that the other ends of the first and second main circuit conductors are used as an input terminal and an output terminal, respectively, and wherein the first dielectric sheet carrying the first main circuit pattern and the first grounding wire is integrated with the second dielectric sheet carrying the second main circuit pattern and the second grounding wire, thereby to provide a filter circuit having a function of an inductor and a function of a capacitor.

In one preferred form of the invention, each of the first main circuit conductor and the second main circuit conductor is plated in advance with a solder, and the first main circuit conductor and second main circuit conductor each plated with the solder are respectively bonded by soldering to the first and third spiral coil patterns formed from the conductive paste.

In another preferred form of the invention, a plurality of the first main circuit conductors and a plurality of the second main circuit conductors which are plated with the solder have a laminated structure comprising a stack of a plurality of layers, such that the laminated structure is formed with a thickness that provides a desired cross sectional area.

According to another aspect of the present invention, there is provided a noise-cut filter which includes a plurality of noise-cut filters each of which is constructed as described above, a plurality of split cores that are assembled into a case in which the plurality of noise-cut filters are stored, and a resin material which fills a space between the noise-cut filters and the split cores for sealing the case.

The resin material may consist of a high polymer resin material which contains an inorganic filler in a predetermined proportion.

The resin material may consist of a silicone gel, and a high polymer resin material which contains an inorganic filler in a predetermined proportion. In this case, the high polymer resin material fills only one end portion of the space within the case where the input and output terminals of each noise-cut filter are located, and the silicon gel fills a remaining portion of the space within the case.

The resin material may consist of a silicon gel, and a cover may be provided at one end of the case at which the input and output terminals of each noise-cut filter are located, for fixing the input and output terminals.

According to a further aspect of the invention, there is provided an apparatus comprising a power converter including a switching device, and a noise-cut filter constructed as described above, wherein the noise-cut filter is connected to an input stage or an output stage of the power converter, so as to filter switching noises that occur upon a switching operation of the switching device.

The present invention also provides an apparatus comprising a power converter including a switching device, and a noise-cut filter constructed as described above, wherein the noise-cut filter is connected to a circuit within the power converter, so as to filter switching noises that occur upon a switching operation of the switching device.

According to another aspect of the present invention, there is provided a method for manufacturing a noise-cut filter, comprising the steps of: forming first and second spiral coil patterns on opposite surfaces of a first dielectric sheet in the form of a flat sheet, such that the first and second spiral coil patterns are aligned with each other in a direction perpendicular to a plane of the first dielectric sheet, the first and second spiral coil patterns being formed from a conductive paste; forming a first main circuit pattern having a function of inductors by bonding a first main circuit conductor to the first spiral coil pattern formed on one of the opposite surfaces of the first dielectric sheet, the first main circuit conductor being formed by stamping with a punch press so that the conductor has a cross sectional area large enough to allow a desired level of current to flow therethrough, and has substantially the same shape as the first spiral coil pattern; bonding a first grounding wire to the second spiral coil pattern formed on the other surface of the first dielectric sheet remote from the first main circuit pattern, the first grounding wire leading a current involving noises that flows from the first main circuit pattern into the second spiral coil pattern via the first dielectric sheet having a function of capacitors, to a ground terminal; forming third and fourth spiral coil patterns on opposite surfaces of a second dielectric sheet in the form of a flat sheet, such that the third and fourth spiral coil patterns are aligned with each other in a direction perpendicular to a plane of the second dielectric sheet, the third and fourth spiral coil patterns being formed from a conductive paste; forming a second main circuit pattern having a function of inductors by bonding a second main circuit conductor to the third spiral coil pattern formed on one of the opposite surfaces of the second dielectric sheet, the conductor being formed by stamping with a punch press so that the conductor has a cross sectional area large enough to allow a desired level of current to flow therethrough, and has substantially the same shape as the third spiral coil pattern; bonding a second grounding wire to the fourth spiral coil pattern formed on the other surface of the second dielectric sheet remote from the second main circuit pattern, the second grounding wire leading a current involving noises that flows from the second main circuit pattern into the fourth spiral coil pattern via the second dielectric sheet having a function of capacitors, to a ground terminal; and interposing an insulating sheet in the form of a flat sheet, between the first dielectric sheet carrying the first main circuit pattern and the first grounding wire, and the second dielectric sheet carrying the second main circuit pattern and the second grounding wire; wherein one end of the first main circuit conductor is connected to one end of the second main circuit conductor, such that the other ends of the first and second main circuit conductors are used as an input terminal and an output terminal, respectively; wherein the first dielectric sheet carrying the first main circuit pattern and the first grounding wire is integrated with the second dielectric sheet carrying the second main circuit pattern and the second grounding wire, thereby to provide a noise-cut filter having a function of an inductor and a function of a capacitor.

BRIEF DESCRIPTION OF THE DRAWINGS

The invention will be described in greater detail with reference to certain preferred embodiments thereof arid the accompanying drawings, wherein:

FIG. 1(a) through FIG. 1(d) are views showing respective process steps of a method for manufacturing a noise-cut filter according to the first embodiment of the present invention;

DETAILED DESCRIPTION OF THE PREFERRED EMBODIMENTS

Figure 2:
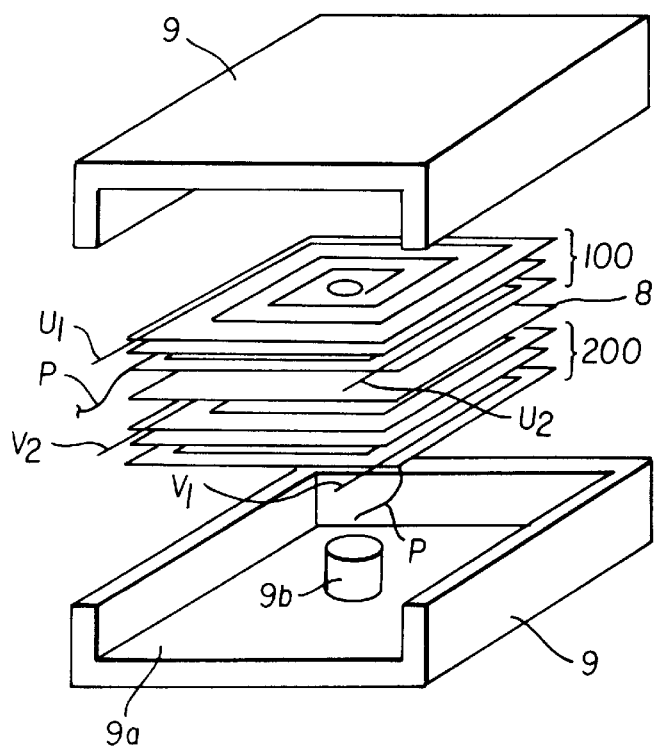
FIG. 2 is a view showing a process step following the steps of FIG. 1 in the method for manufacturing the noise-cut filter.

Some preferred embodiments of the present invention will be described in detail with reference to the drawings.

Referring first to FIG. 1 through FIG. 6, the first embodiment of the present invention will be described. Initially, a method for manufacturing a noise-cut filter according to the present invention will be described with reference to FIG. 1 through FIG. 3.

In the process step 1 shown in FIG. 1(a), a dielectric sheet 1 is prepared which is formed of a ferroelectric ceramic material, such as $BaTO_3$ or PZT. The thickness of the dielectric sheet 1 is in the range of 100 μm to 1 mm. In this embodiment, the dielectric sheet 1 has a thickness of about 0.5 mm.

Then, spiral coil patterns 2a, 2b, which are formed from a conductive paste, are formed on the front and rear surfaces of the dielectric sheet 1, such that the coil patterns 2a, 2b are aligned with each other in a direction perpendicular to the plane of the dielectric sheet 1. The conductive paste may contain, for example, Ag as a major component. While the conductive paste may be applied to the dielectric sheet 1 by screen printing and then cured to form the patterns in the process step 1 of FIG. 1(a), the patterns may also be formed by depositing copper or other material by sputtering, vacuum evaporation, or plating.

In the process step 2 shown in FIG. 1(b), a coil 3a (i.e., the first main circuit conductor) formed by stamping and having the same shape as the coil pattern 2a is bonded, by soldering, onto the coil pattern 2a formed on one surface of the dielectric sheet 1. The coil 3a and the coil pattern 2a thus bonded together provide a first main circuit pattern 4a which functions as inductors.

The coil 3a is formed from a copper sheet, or the like, by stamping with a punch press, such that the coil 3a has a cross sectional area that is required to allow passage of the current of a main circuit (for example, a circuit of a power converter). More specifically, the stamped coil 3a may be formed with a cross sectional area large enough to allow the current of 1 A to several dozens of amperes to pass through the coil 3a, and a thickness in the range of 0.5 mm to 1.0 mm.

The stamped coil 3a is formed at one end thereof with a pulled-out region having a certain length, which region is pulled outward to be mounted on a printed wiring board with a pin inserted therein, so that the coil 3a is connected with an external circuit. In FIG. 1(b), the pulled-out region or terminal at the above-indicated one end of the coil 3a is denoted by $U_1$.

Figure 4:
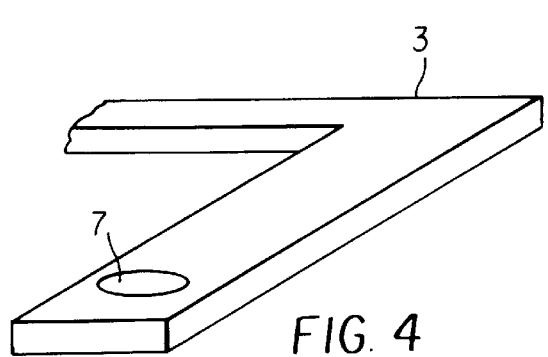
FIG. 4 is a perspective view showing the shape of a through-hole formed through one end portion of a stamped coil.

A through-hole 7 is formed in advance through the other end of the stamped coil 3a located at the center of the coil, and through a portion of the dielectric sheet 1 located below the other end of the coil 3a, as shown in FIG. 4. With this arrangement, a sufficiently large number of turns of the coil can be provided, and the coil pattern may be connected with other pattern(s) using a pin inserted through the through-hole 7.

In the process step 3 shown in FIG. 1(c), a lead wire 2c for grounding, which allows passage of the current of a noise component, is bonded by soldering to the coil pattern 2b formed on the surface of the dielectric sheet 1 opposite to the surface on which the first main circuit pattern 4a is formed. Here, the current of the noise component means the current caused by a noise component produced when the current flowing through the first main circuit pattern 4a flows into the coil pattern 2a through the dielectric sheet 1 having a function of capacitors.

By executing the process steps 1 to 3 as described above, a substrate A which serves as an inductor and a capacitor is fabricated in which the first main circuit pattern 4a having one terminal $U_1$ is formed on the above-indicated one surface of the dielectric sheet 1, and the coil pattern 2b having the lead wire 2c is formed on the other surface of the dielectric sheet 1.

In the process step 4 shown in FIG. 1(d), a substrate B having a similar structure to the substrate A as described above is fabricated. In this case, the substrate B is constructed such that a second main circuit pattern 4b is formed on one surface of a dielectric sheet 5, and a coil pattern 2b is formed on the other surface of the dielectric sheet 5. The second main circuit pattern 4b is formed at one end thereof with a pulled-out region having a certain length, which is pulled outside the dielectric sheet 5 for connection with an external circuit. In FIG. 1(d), the pulled-out region or terminal at the above-indicated one end of the coil 3b (i.e., the second main circuit conductor) is denoted by $U_2$. The substrate B thus constructed functions as inductors and capacitors, in a similar manner to the substrate A.

In the process step 4 of FIG. 1(d), the substrate A with the first main circuit pattern 4a formed on the dielectric sheet 1, and the substrate B with the second main circuit pattern 4b formed on the dielectric sheet 5 are connected to each other via an inter-layer insulating sheet 6. The inter-layer insulating sheet 6 is formed with a through-hole 7 that communicate with the through-holes 7 formed through the substrates A, B. With the through-hole 7 thus formed, it is possible to integrate the substrates A, B by fixing these substrates by soldering, using a pin inserted through the through-hole 7. Thus, the number of turns of coils can be increased by increasing the number of substrates.

By fixing the substrates A, B with the pin in the above manner, the inner end of the first main circuit pattern 4a and the inner end of the second main circuit pattern 4b can be electrically connected to each other, so that the first main circuit pattern 4a is connected in series with the second main circuit pattern 4b. As a result, the one end or terminal $U_1$ that is pulled outside the first main circuit pattern 4a and the one end or terminal $U_2$ that is pulled outside the second main circuit pattern 4b may be used as electric input and output terminals.

The grounding coil patterns 2b of the substrates A, B are also connected to each other by use of a through hole (not illustrated), as is the case with the coil patterns 2a (corresponding to the first main circuit pattern 4a and the second main circuit pattern 4b). In FIG. 1(d), a ground terminal of the connected grounding coil patterns 2b is denoted by P. The through-hole of the coil patterns 2a for the main circuit is formed at a location different from that of the through-hole of the coil patterns 2b for the ground circuit, so that these through-holes do not overlap with each other.

By executing the process step 1 to step 4, the substrate A with the first main circuit pattern 4a formed on the first dielectric sheet 1 and the substrate B with the second main circuit pattern 4b formed on the second dielectric sheet 5 are integrated together, to provide one set of noise-cut filter circuit 100 which functions as inductors and capacitors. In this case, the above-indicated one end of the first main circuit pattern 4a is connected to the corresponding end of the second main circuit pattern 4b so that the other ends of the circuit patterns 4a, 4b that are not connected to each other can be used as an input terminal $U_1$ and output terminal $U_2$.

In the process step 5 shown in FIG. 2, two sets of noise-cut filters each fabricated by executing the process step 1 through step 4 are prepared. In FIG. 2, the input and output terminals of the first set of the noise-cut filter 100 are denoted by $U_1$ and $U_2$, and the input and output terminals of the second set of the noise-cut filter 200 are denoted by $V_1$ and $V_2$, respectively. An insulating sheet 8 is interposed between the first set of noise-cut filter 100 and the second set of noise-cut filter 200, and the stacked layers of these circuits are sandwiched between a pair of split magnetic cores 9 in a direction perpendicular to the plane of the layers. As a result, the two sets of the noise-cut filters 100, 200 are stored in one case in the form of an assembly of the split magnetic cores 9 (which will be referred to as a magnetic core assembly).

As shown in FIG. 2, an opening 9a is formed through one side of the magnetic core assembly 9, such that the lead wires of the input and output terminals $U_1$, $U_2$ and the input and output terminals $V_1$ and $V_2$ can be taken out of the core assembly 9 through the opening 9a. The magnetic core 9 may be formed of ferrite, for example. Also, a protrusion 9b for positioning and fixing the layers of the filters 100, 200 is formed at a central portion of the inner surface of each magnetic core 9.

If two sets of noise-cut filters are interposed between the split magnetic cores 9, a single-phase noise-cut filter used for a line filter having a composite structure of a common-mode reactor and grounding capacitors may be formed. If three sets of noise-cut filters are interposed between the magnetic cores 9, a three-phase noise-cut filter having the same structure may be formed.

Figure 3:
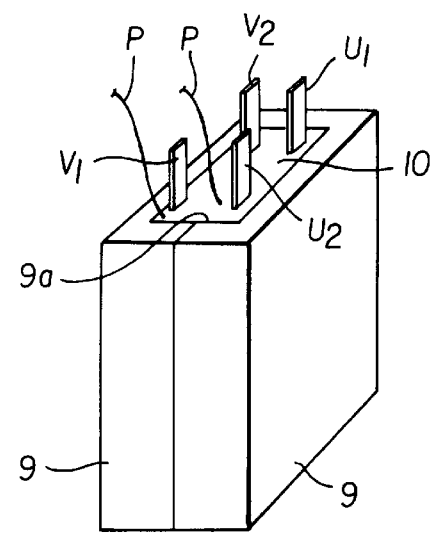
FIG. 3 is a view showing a process step following the step of FIG. 2 in the method for manufacturing the noise-cut filter.

In the process step 6 of FIG. 3, a high polymer resin material 10 is poured into clearances or space within the case, through the opening 9a of the magnetic core assembly 9 in which the two sets of noise-cut filters 100, 200 (that provide a single-phase filter) are stored, and then solidified. With the noise-cut filters 100, 200 mounted in this manner, lead terminals for two phases, namely, the input and output terminals $U_1$, $U_2$ of the first main circuit pattern of the noise-cut filter 100 and the input and output terminals $V_1$, $V_2$ of the second main circuit pattern of the noise-cut filter 200 are pulled out through the opening 9a of the magnetic core assembly 9. The lead terminals thus protruding outwards may be bonded by soldering to sockets, or the like, of a printed wiring board, utilizing pin-insertion or surface mounting. Thus, the lead terminals integrated with the substrates may be treated as a single packaging.

Figure 5:
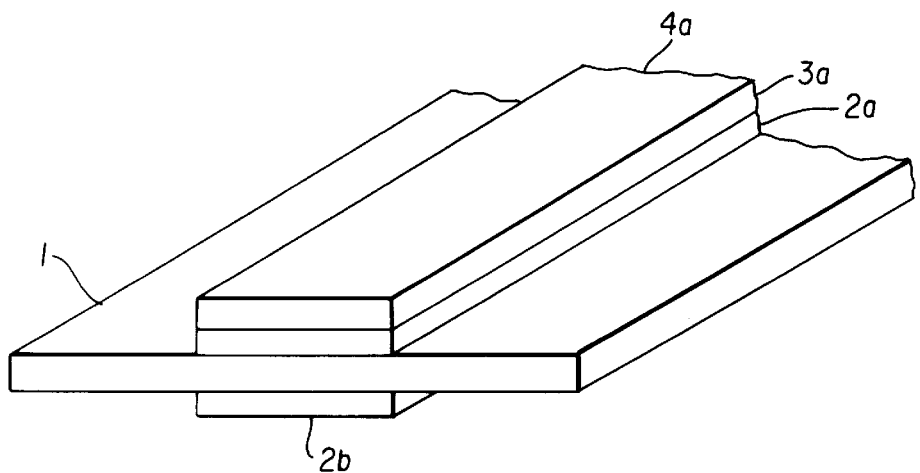
FIG. 5 is a perspective view showing the basic structure of the noise-cut filter.
Figure 6:
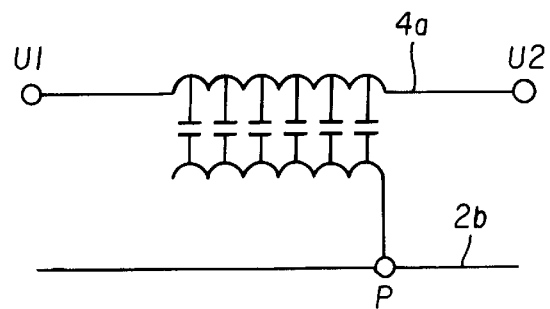
FIG. 6 is a circuit diagram showing a distributed constant LC circuit.

Referring next to FIG. 5 and FIG. 6, electric characteristics of the substrate structure will be now explained. In FIG. 5, the first main circuit pattern 4a that serves as a conductor for an inductor has a cross sectional area large enough to allow the passage of the current of the main circuit of the power converter (not illustrated). The first main circuit pattern 4a consists of the coil pattern 2a disposed on the dielectric sheet 1 and formed from a conductive paste, and the coil 3a formed by stamping a conductive material. The coil pattern 2b that serves as a grounding conductor is formed on the dielectric sheet 1 such that the coil pattern 2b is aligned with the first main circuit pattern 4a in the direction perpendicular to the plane of the dielectric sheet 1.

Since the coil pattern 2b serving as a grounding conductor is merely required to lead the current of the noise component flowing through the dielectric sheet 1, to a ground terminal, the cross sectional area of the coil pattern 2b may be made smaller than that of the first main circuit pattern 4a. The substrate structure of the second main circuit pattern 4b is similar to that of the first main circuit pattern 4a, and therefore will not be explained.

In FIG. 6, minute inductances are continuously distributed over the length of the terminals $U_1$, $U_2$ of the first main circuit pattern 4a. Similarly, minute inductances are continuously distributed along the coil pattern 2b, that serves as a grounding conductor. Since the first main circuit pattern 4a and the coil pattern 2b are aligned with each other with the dielectric sheet 1 interposed therebetween, minute capacitances are continuously formed between these patterns 4a, 2b, to thus provide a distributed constant circuit having the function of a low-pass filter. The low-pass filter is supposed to have a cut-off frequency (for example, 150 kHz or higher) sufficient to filter switching noises that occur upon switching operations of semiconductor switching devices that constitute a power converter, such as an inverter.

Figure 7:
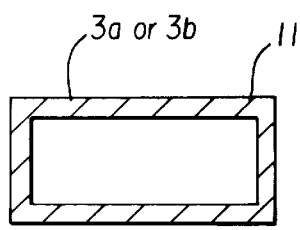
FIG. 7 is a cross-sectional view showing a stamped coil that is plated with a solder according to the second embodiment of the present invention.
Figure 8:
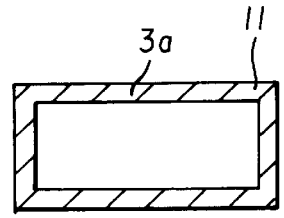
FIG. 8 is a cross-sectional view showing the structure in which stamped coils are laminated on a coil pattern formed on a dielectric sheet.
Figure 8:
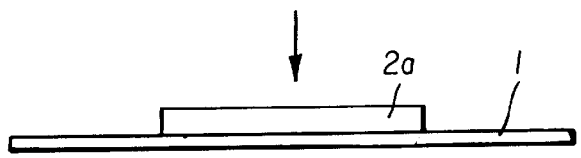

Referring next to FIG. 7 and FIG. 8, the second embodiment of the present invention will be now described.

FIG. 7 is a cross-sectional view in which a solder 11 is applied by plating to the surface of the stamped coil 3a or 3b as a part of the first main circuit pattern 4a or second main circuit pattern 4b. The solder 11 with which the coil 3a or 3b is plated may be selected from alloys, such as Sn/Pb and Sn/Ag. The stamped coil 3a or 3b thus plated with the solder 11 may be easily soldered to the coil pattern 2a formed from a conductive paste in the process step 2 as described above.

FIG. 8 shows an example in which two layers of stamped coils 3a plated with solders 11 are laminated together and bonded to the coil pattern 2a formed on the dielectric sheet 1. With the stamped coils 3a thus laminated on each other, the current capacity, or the current that can pass through the coils 3a, can be easily increased. It is also possible to laminate three or more layers of stamped coils 3a.

Figure 9:
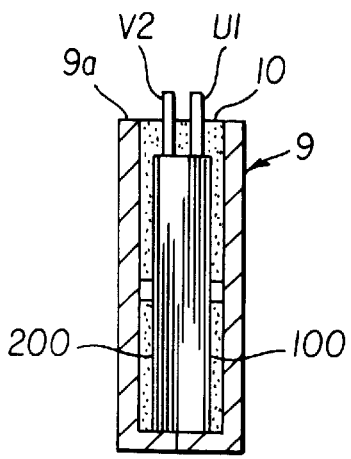
FIG. 9 is a cross-sectional view showing the construction of a noise-cut filter according to the third embodiment of the present invention, wherein noise-cut filters are stored in a case.

Referring to FIG. 9, the third embodiment of the present invention will be now described.

FIG. 9 shows the structure of a noise-cut filter in which two sets of noise-cut filters 100, 200 are stored in a magnetic core assembly 9. In this embodiment, a high polymer resin material 10 which is different from that of the embodiment of FIG. 3 is used for filling clearances between the magnetic core assembly 9 and the noise-cut filters 100, 200, so as to seal the noise-cut filters.

The high polymer resin material 10 used in the present embodiment may consist of epoxy resin, urethane resin, or the like, to which an inorganic filler, such as quartz powder or alumina powder, is added. The coefficient of thermal expansion of the high polymer resin material 10 needs to be equivalent to that of the magnetic core 9, so as to avoid strains due to thermal stresses.

By using the high polymer resin material 10 as described above for sealing the magnetic core assembly 9, the insulating characteristic of the filler is improved, and the noise-cut filters 100, 200 can be protected against contamination due to dust or other foreign matters that would otherwise to enter the core assembly 9 through the opening 9a, thereby preventing reduction of the insulating capability.

The addition of the inorganic filler to the high polymer resin material 10 makes it possible for the noise-cut filters 100, 200 to dissipate heat generated by current flowing therethrough. Furthermore, the lead terminals $U_1$, $U_2$ of the first main circuit pattern 4a and the lead terminals $V_1$, $V_2$ of the second main circuit pattern 4b are fixed by the high polymer resin material 10 of the above-indicated type. With the lead terminals thus fixed in position, even when an external force is applied to the lead terminals $U_1$, $U_2$ and $V_1$, $V_2$, the force is prevented from being applied to the noise-cut filters 100, 200 embedded in the resin material 10.

The fourth embodiment of the present invention will be described with reference to FIG. 10.

Figure 10:
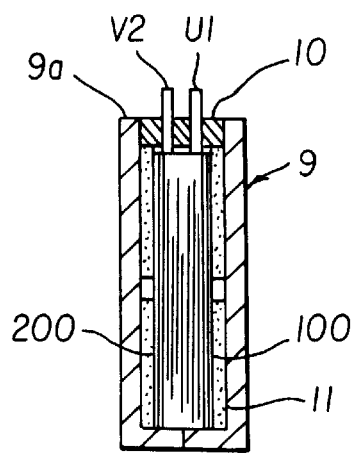
FIG. 10 is a cross-sectional view showing the construction of a noise-cut filter according to the fourth embodiment of the present invention, wherein noise-cut filters are stored in a case.

FIG. 10 shows the structure in which two sets of noise-cut filters 100, 200 are stored in an assembly of split magnetic cores 9. In the present embodiment, a silicone gel 11 for sealing fills clearances between the magnetic core assembly 9 and the noise-cut filters 100, 200, such that the gel 11 fills up to a level spaced slightly from the opening 9a, and a high polymer resin material 10 for sealing fills the remaining space above the silicone gel 11, up to a level of the opening 9a, such that the resin material 10 is exposed to the outside of the magnetic core assembly 9. The high polymer resin material 10 may be selected from the above-indicated materials.

By suitably selecting the materials for sealing the inside and surface of the case, the insulating characteristic is improved, and the noise-cut filters 100, 200 can be protected against contamination due to dust or other foreign matters that would otherwise enter the case through the opening 9a, thereby preventing deterioration of the insulating characteristic.

The use of the silicone gel 11 having a relatively low modulus of elasticity is advantageous since strains do not arise due to thermal strains, assuring an improved mechanical reliability. Furthermore, the lead terminals $U_1$, $U_2$ of the first main circuit pattern 4a and the lead terminals $V_1$, $V_2$ of the second main circuit pattern 4b are fixed in place by the high polymer resin material 10, and therefore, even if an external force is applied to the lead terminals $U_1$, $U_2$ and $V_1$, $V_2$, the force is advantageously prevented from being applied to the noise-cut filters 100, 200 inside the magnetic core assembly 9.

Figure 11:
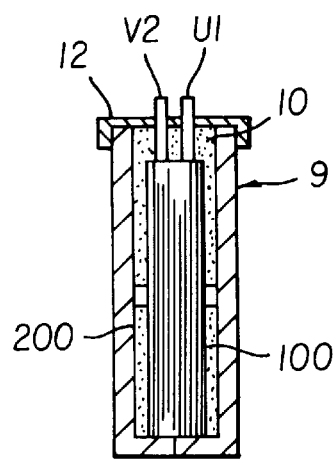
FIG. 11 is a cross sectional view showing the construction of a noise-cut filter according to the fifth embodiment of the present invention, wherein noise-cut filters are stored in a case.

Referring to FIG. 11, the fifth embodiment of the present invention will be described. FIG. 11 shows the structure in which two sets of noise-cut filters 100, 200 are stored in the magnetic core assembly 9. In the present embodiment, a silicone gel 11 for sealing fills clearances between the magnetic core assembly 9 and the noise-cut filters 100, 200, up to a level of the opening 9a, and the opening 9a is covered with a terminal fixing cover 12, so that the lead terminals $U_1$, $U_2$ of the first main circuit pattern 4a and the lead terminals $V_1$, $V_2$ of the second main circuit pattern 4b are fixed in place by the cover 12.

With the cover 12 used for fixing the terminals, even when an external force is applied to the lead terminals $U_1$, $U_2$, and $V_1$, $V_2$, the force is prevented from being applied to the noise-cut filters 100, 200 placed in the magnetic core assembly 9. Moreover, the noise-cut filters 100, 200 can be protected against contamination due to dust or other foreign matters that would otherwise enter the magnetic core assembly 9 through the opening 9a, thereby preventing deterioration of the insulating characteristic. The cover 12 for fixing terminals may be formed of a high-polymer resin material, such as PPS (polyphenylene sulfide) or PBT (polybutylene terephthalate).

Figure 12:
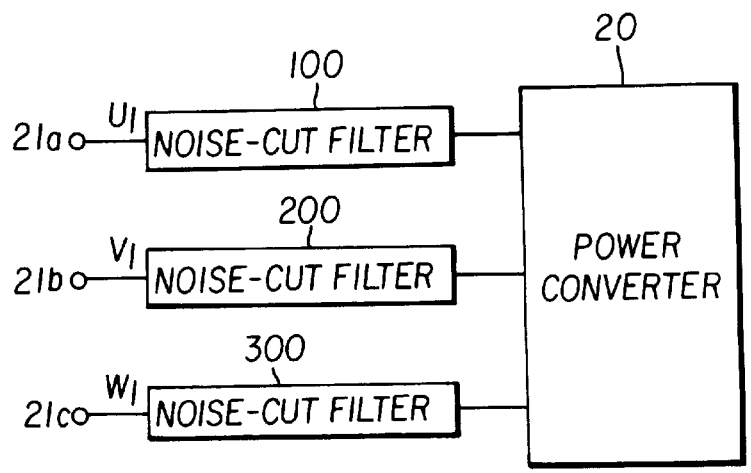
FIG. 12 is a block diagram showing an arrangement in which noise-cut filters for three phases are connected to the input stage of a power converter according to the sixth embodiment of the present invention.
Figure 13:
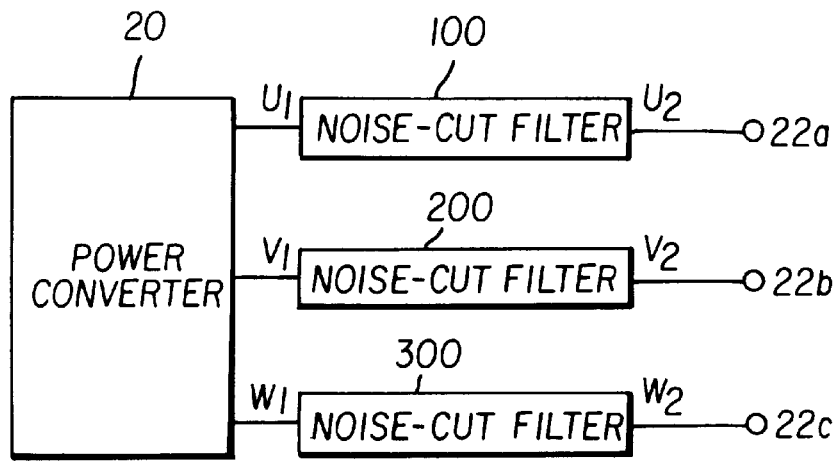
FIG. 13 is a block diagram showing an arrangement in which noise-cut filters for three phases are connected to the output stage of a power converter.
Figure 14:
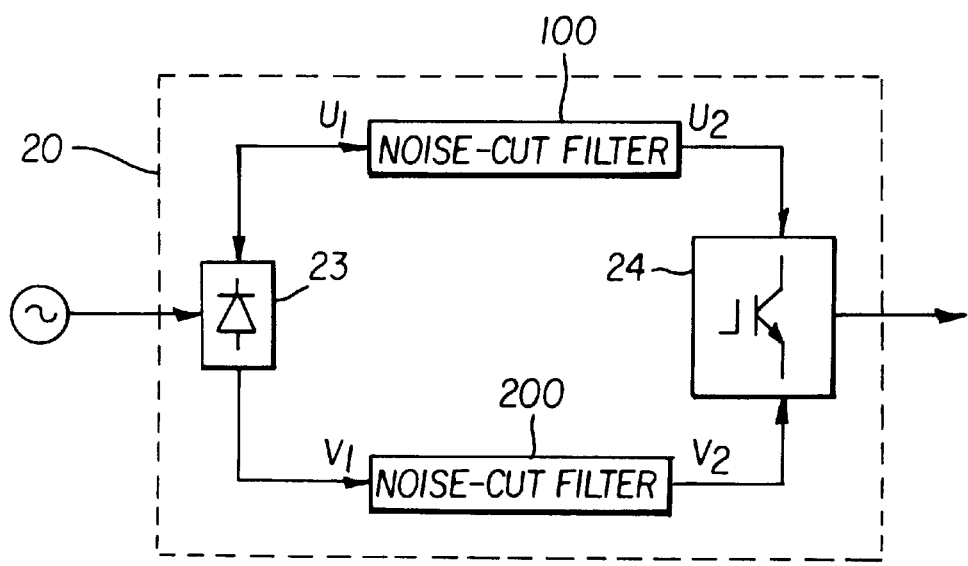
FIG. 14 is a block diagram showing an arrangement in which noise-cut filters are incorporated within a power converter.

Referring next to FIG. 12 through FIG. 14, the sixth embodiment of the present invention will be described in detail.

FIG. 12 shows an example in which three sets of noise-cut filters 100, 200, 300 for a three-phase noise-cut filter are provided at the input stage of a power converter 20, such as an inverter.

While the noise-cut filters 100, 200 for a single-phase filter are stored in the magnetic core assembly 9 in the embodiments of FIG. 1 through FIG. 11, an additional noise-cut filter 300 may be mounted below the noise-cut filter 200 in the process step 5 of FIG. 2, so as to provide a three-phase noise-cut filter.

In the noise-cut filter thus constructed, the noise-cut filter 100 includes lead terminals $U_1$, $U_2$, and the noise-cut filter 200 includes lead terminals $V_1$, $V_2$, while the noise-cut filter 300 includes lead terminals $W_1$, $W_2$. The lead terminals $U_1$, $V_1$, $W_1$ are connected to terminals 21a, 21b, 21c of an electric circuit (not illustrated) located at the input side, respectively, and the lead terminals $U_2$, $V_2$, $W_2$ are connected to the power converter 20.

With the lead terminals thus connected, the noise-cut filters 100, 200, 300 are able to filter low-frequency noises which would otherwise transmitted along with signals from the terminals 21a, 21b, 21c to the power converter 20, and also prevent switching noises generated by switching devices of the power converter 20 from being transmitted to the terminals 21a, 21b, and 21c.

FIG. 13 shows an example in which three sets of noise-cut filters 100, 200, 300 for a three-phase filter according to the present invention are provided at the output stage of a power converter 20, such as an inverter.

The lead terminals $U_1$, $V_1$, $W_1$ are connected to the power converter 20, and the lead terminals $U_2$, $V_2$, $W_2$ are connected to the terminals 22a, 22b, 22c of an electric circuit (not illustrated) located at the output side. With the lead terminals connected in this manner, the noise-cut filters 100, 200, 300 are able to filter switching noises and others generated by switching devices of the power converter 20, thereby to prevent the switching noises from being transmitted from the power converter 20 to the terminals 22a, 22b, 22c. Also, the noise-cut filters 100, 200, 300 can filter low-frequency noises entering the power converter 20 from the terminals 22a, 22b, 22c.

FIG. 14 shows an example in which two sets of noise-cut filters 100, 200 are provided inside a power converter 20, such as an inverter.

The power converter 20 incorporates a rectifier 23 provided on the input side thereof for converting input ac current into dc current, and a semiconductor switching device 22 provided on the output side. The lead terminals $U_1$, $V_1$ of the noise-cut filters 100, 200 are connected to the input-side rectifier 23, and the lead terminals $U_2$, $V_2$ of the noise-cut filters 100, 200 are connected to the output-side switching device 24.

With the lead terminals $U_1$, $U_2$ and $V_1$, $V_2$ connected in this manner, the noise-cut filters 100, 200 are able to filter switching noises that occur upon switching operations of the semiconductor switching device 24 of the power converter 20.

As explained above, according to the present invention, spiral conductor patterns formed from a conductive paste are formed on the opposite surfaces of a dielectric sheet, such that the conductor patterns are aligned with each other in a direction perpendicular to the plane of the dielectric sheet, and a main circuit pattern is constructed by bonding a conductor to the conductor pattern formed on one of the opposite surfaces of the dielectric sheet. The conductor is formed by stamping with a punch press so that the conductor has a cross sectional area large enough to allow a desired level of current to flow therethrough, and has substantially the same shape as the spiral coil pattern having the function of inductors. Further, a grounding wire is bonded to the conductor pattern formed on the other surface of the dielectric sheet, so that the grounding wire leads the current involving noises which flows from the main circuit pattern into the conductor pattern via the dielectric sheet having the function of capacitors, to a ground terminal. Thus, a noise-cut filter having the function of inductors and capacitors is provided which is able to sufficiently filter or cut low-frequency noises, such as switching noises of a power converter, while permitting the passage of current of several amperes or greater that is required for power conversion.

According to the manufacturing method of the present invention, a plurality of noise-cut filters are stored or packaged in a magnetic core assembly, and then a high polymer resin material is used for filling clearances or space in the core assembly, so as to seal the filter. Thus, a small-sized, inexpensive noise-cut filter can be easily produced by a simple manufacturing process, so that the noise-cut filter can be easily mounted on a printed wiring board, while assuring excellent insulating property and mechanical reliability.

What is claimed is:

1. A noise-cut filter having distributed inductances and distributed capacitances, comprising:

a first dielectric sheet;

first and second spiral coil patterns formed on opposite surfaces of said first dielectric sheet, respectively, such that the first and second spiral coil patterns are aligned with each other in a direction perpendicular to a plane of the first dielectric sheet to continuously overlap, said first and second spiral coil patterns comprising a conductive paste;

a first main circuit pattern comprising a first main circuit conductor bonded to said first spiral coil pattern, said first main circuit conductor having a cross sectional area large enough to allow a desired level of current to flow therethrough, and having substantially the same shape as the first spiral coil pattern;

a first grounding wire bonded to said second spiral coil pattern formed on the other surface of said first dielectric sheet remote from said first main circuit pattern;

a second dielectric sheet;

third and fourth spiral coil patterns formed on opposite surfaces of said second dielectric sheet, respectively, such that the third and fourth spiral coil patterns are aligned with each other in a direction perpendicular to a plane of the second dielectric sheet to continuously overlap, said third and fourth spiral coil patterns comprising a conductive paste;

a second main circuit pattern comprising a second main circuit conductor bonded to said third spiral coil pattern, said second main circuit conductor having a cross sectional area large enough to allow a desired level of current to flow therethrough, and having substantially the same shape as the third spiral coil pattern;

a second grounding wire bonded to said fourth spiral coil pattern formed on the other surface of said second dielectric sheet remote from said second main circuit pattern; and an insulating sheet which is interposed between said first dielectric sheet carrying said first main circuit pattern and said first grounding wire, and said second dielectric sheet carrying said second main circuit pattern and said second grounding wire thereon;

wherein one of opposite ends of said first main circuit conductor is connected to one of opposite ends of said second main circuit conductor, such that the other ends of the first and second main circuit conductors are used as an input terminal and an output terminal, respectively.

2. A noise-cut filter as claimed in claim 1, wherein each of said first main circuit conductor and said second main circuit conductor is plated in advance with a solder, and said first main circuit conductor and second main circuit conductor each plated with the solder are respectively bonded by soldering to the first and third spiral coil patterns formed from the conductive paste.

3. A noise-cut filter as claimed in claim 2, wherein each of said first main circuit conductor and second main circuit conductor which is plated with the solder has a laminated structure comprising a stack of a plurality of layers, such that the laminated structure is formed with a thickness that provides a desired cross sectional area.

4. An apparatus comprising:
- a plurality of noise-cut filters having distributed inductances and distributed capacitances;
- a case including first and second split cores, wherein said plurality of noise-cut filters are located between said first and second split cores; and
- a resin material located between said noise-cut filters and said split cores for sealing said case;
- wherein each of said plurality of noise-cut filters comprises:
  - a first dielectric sheet;
  - first and second spiral coil patterns formed on opposite surfaces of said first dielectric sheet, respectively, such that said first and second spiral coil patterns are aligned with each other in a direction perpendicular to a plane of said first dielectric sheet to continuously overlap, said first and second spiral coil patterns comprising a conductive paste;
  - a first main circuit pattern comprising a first main circuit conductor bonded to said first spiral coil pattern, said first main circuit conductor having a cross sectional area large enough to allow a desired level of current to flow therethrough, and having substantially the same shape as said first spiral coil pattern;
  - a first grounding wire bonded to said second spiral coil pattern formed on the other surface of said first dielectric sheet remote from said first main circuit pattern;
  - a second dielectric sheet;
  - third and fourth spiral coil patterns formed on opposite surfaces of said second dielectric sheet, respectively, such that said third and fourth spiral coil patterns are aligned with each other in a direction perpendicular to a plane of said second dielectric sheet to continuously overlap, said third and fourth spiral coil patterns comprising a conductive paste;
  - a second main circuit pattern comprising a second main circuit conductor bonded to said third spiral coil pattern, said conductor having a cross sectional area large enough to allow a desired level of current to flow therethrough, and having substantially the same shape as said third spiral coil pattern;
  - a second grounding wire bonded to said fourth spiral coil pattern formed on the other surface of said second dielectric sheet remote from said second main circuit pattern; and
  - an insulating sheet which is interposed between said first dielectric sheet carrying said first main circuit pattern and said first grounding wire, and said second dielectric sheet carrying said second main circuit pattern and said second grounding wire thereon;
  - wherein one of opposite ends of said first main circuit conductor is connected to one of opposite ends of said second main circuit conductor, such that the other ends of the first and second main circuit conductors are used as an input terminal and an output terminal, respectively.

5. An apparatus as claimed in claim 4, wherein said resin material comprises a high polymer resin material which contains an inorganic filler in a predetermined proportion.

6. An apparatus as claimed in claim 4, wherein said resin material comprises a silicone gel, and a high polymer resin material which contains an inorganic filler in a predetermined proportion, said high polymer resin material filling only one end portion of a space within said case where said input and output terminals of said each noise-cut filter are located, said silicon gel filling a remaining portion of the space within said case.

7. An apparatus as claimed in claim 4, further comprising a cover provided at one end of said case at which the input and output terminals of said each noise-cut filter are located, for fixing the input and output terminals, wherein said resin material comprises a silicone gel.

8. An apparatus as claimed in claim 4, further comprising a power converter including a switching device, wherein at least one of said plurality of noise-cut filters is connected to one of an input stage and an output stage of the power converter.

9. A power converter comprising:
- a noise-cut filter;
- a rectifier device to which said noise-cut filter is connected at an input terminal thereof; and
- a switching device to which said noise-cut filter is connected at an output terminal thereof;
- wherein said noise-cut filter comprises:
  - a first dielectric sheet;
  - first and second spiral coil patterns formed on opposite surfaces of said first dielectric sheet, respectively, such that said first and second spiral coil patterns are aligned with each other in a direction perpendicular to a plane of said first dielectric sheet to continuously overlap, said first and second spiral coil patterns comprising a conductive paste;
  - a first main circuit pattern comprising a first main circuit conductor bonded to said first spiral coil pattern, said first main circuit conductor having a cross sectional area large enough to allow a desired level of current to flow therethrough, and having substantially the same shape as said first spiral coil pattern;
  - a first grounding wire bonded to said second spiral coil pattern formed on the other surface of said first dielectric sheet remote from said first main circuit pattern;
  - a second dielectric sheet;
  - third and fourth spiral coil patterns formed on opposite surfaces of said second dielectric sheet, respectively, such that said third and fourth spiral coil patterns are aligned with each other in a direction perpendicular to a plane of said second dielectric sheet to continuously overlap, said third and fourth spiral coil patterns comprising a conductive paste;
  - a second main circuit pattern comprising a second main circuit conductor bonded to said third spiral coil pattern, said second main circuit conductor having a cross sectional area large enough to allow a desired level of current to flow therethrough, and having substantially the same shape as the third spiral coil pattern;
  - a second grounding wire bonded to said fourth spiral coil pattern formed on the other surface of said second dielectric sheet remote from said second main circuit pattern; and
  - an insulating sheet which is interposed between said first dielectric sheet carrying said first main circuit pattern and said first grounding wire, and said second dielectric sheet carrying said second main circuit pattern and said second grounding wire thereon;
  - wherein one of opposite ends of said first main circuit pattern is connected to one of opposite ends of said second main circuit pattern, such that the other ends of the first and second main circuit patterns are used as an input terminal and an output terminal, respectively.

* * * * *